(12) United States Patent
Nagai

(10) Patent No.: US 9,484,349 B1
(45) Date of Patent: Nov. 1, 2016

(54) STATIC RANDOM ACCESS MEMORY

(71) Applicant: Powerchip Technology Corporation, Hsinchu (TW)

(72) Inventor: Yukihiro Nagai, Hsinchu (TW)

(73) Assignee: Powerchip Technology Corporation, Hsinchu (TW)

(*) Notice: Subject to any disclaimer, the term of this patent is extended or adjusted under 35 U.S.C. 154(b) by 0 days.

(21) Appl. No.: 14/924,729

(22) Filed: Oct. 28, 2015

(51) Int. Cl.
*H01L 27/11* (2006.01)

(52) U.S. Cl.
CPC .................................. *H01L 27/1104* (2013.01)

(58) Field of Classification Search
CPC ................................................... H01L 27/1104
See application file for complete search history.

(56) References Cited

U.S. PATENT DOCUMENTS

| 5,670,803 | A | | 9/1997 | Beilstein, Jr. et al. | |
|---|---|---|---|---|---|
| 6,140,684 | A | * | 10/2000 | Chan | H01L 27/11 257/368 |
| 7,138,685 | B2 | | 11/2006 | Hsu et al. | |
| 2016/0027499 | A1 | * | 1/2016 | Liaw | G11C 11/412 365/154 |

FOREIGN PATENT DOCUMENTS

TW 201434112 9/2014

OTHER PUBLICATIONS

"Office Action of Taiwan Counterpart Application", issued on Jun. 8, 2016, p. 1-p. 3.

* cited by examiner

*Primary Examiner* — Fernando L Toledo
*Assistant Examiner* — Neil Prasad
(74) *Attorney, Agent, or Firm* — Jianq Chyun IP Office

(57) ABSTRACT

A static random access memory (SRAM) including at least a SRAM cell is provided. A gate layout of the SRAM cell includes first to fourth strip doped regions, a recessed gate line and first and second gate lines. The first to fourth strip doped regions are disposed in the substrate in order and separated from each other. The recessed gate line intersects the first to fourth strip doped regions. The first to fourth strip doped regions are disconnected at intersections with the recessed gate line. The first gate line intersects the first and the second strip doped regions. The first and the second strip doped regions are disconnected at intersections with the first gate line. The second gate line intersects the third the fourth strip doped regions. The third and the fourth strip dopeds region are disconnected at intersections with the second gate line.

15 Claims, 4 Drawing Sheets

STATIC RANDOM ACCESS MEMORY

BACKGROUND OF THE INVENTION

1. Technical Field

The invention relates to a memory, and particularly relates to a static random access memory.

2. Description of Related Art

Random access memory (RAM) is a volatile memory widely used in information electronic products. In general, RAM can be categorized into a static random access memory (SRAM) and dynamic random access memory (DRAM).

SRAM has a faster data processing speed, and the manufacturing process thereof may be integrated into the manufacturing process of a complementary metal oxide semiconductor (CMOS) transistor. Therefore, the manufacturing process of SRAM is simpler.

However, memory cells of the conventional SRAM take up a relatively greater area, making it unable to effectively increase the integrity of the device. Thus, how to further reduce the size of the SRAM cell has become an issue under vigorous development.

SUMMARY OF THE INVENTION

The invention provides a static random access memory which can effectively reduce the size of the SRAM cell.

The invention provides a static random access memory, including at least one static random access memory cell. A gate layout of the static random access memory cell includes a first strip doped region, a second strip doped region, a third strip doped region, a fourth strip doped region, a recessed gate line, a first gate line, and a second gate line. The first strip doped region, the second strip doped region, the third strip doped region, and the fourth strip doped region are disposed in a substrate in order and separated from each other. The recessed gate line intersects the first strip doped region, the second strip doped region, the third strip doped region, and the fourth strip doped region. The first strip doped region, the second strip doped region, the third strip doped region, and the fourth strip doped region are disconnected at intersections with the recessed gate line. The first gate line intersects the first strip doped region and the second strip doped region. The first strip doped region and the second strip doped region are disconnected at intersections with the first gate line. The second gate line intersects the third strip doped region and the fourth strip doped region. The third strip doped region and the fourth strip doped region are disconnected at intersections with the second gate line.

According to an embodiment of the invention, in the static random access memory, the first strip doped region and the fourth strip doped region have a first conductivity type, and the second strip doped region and the third strip doped region have a second conductivity type.

According to an embodiment of the invention, in the static random access memory, a top surface of the recessed gate line is lower than a top surface of the substrate.

According to an embodiment of the invention, in the static random access memory, the first gate line may be a planar conductive line or a recessed conductive line.

According to an embodiment of the invention, in the static random access memory, the second gate line may be a planar conductive line or a recessed conductive line.

According to an embodiment of the invention, in the static random access memory, the first strip doped region and the second strip doped region between the recessed gate line and the first gate line may be electrically connected through a first connection component.

According to an embodiment of the invention, in the static random access memory, the first connection component may be a slit contact or a combination of a conductive line and a contact.

According to an embodiment of the invention, in the static random access memory, the second gate line may be electrically connected to the first connection component.

According to an embodiment of the invention, in the static random access memory, the third strip doped region and the fourth strip doped region between the recessed gate line and the second gate line may be electrically connected through a second connection component.

According to an embodiment of the invention, in the static random access memory, the second connection component may be a slit contact or a combination of a conductive line and a contact.

According to an embodiment of the invention, in the static random access memory, the first gate line may be electrically connected to the second connection component.

According to an embodiment of the invention, in the static random access memory, at a side of the first gate line and the second gate line away from the recessed gate line, the second strip doped region and the third strip doped region may be electrically connected through a third connection component.

According to an embodiment of the invention, in the static random access memory, the third connection component may be a slit contact, a doped region for connection, or a combination of a conductive line and a contact.

According to an embodiment of the invention, in the static random access memory, the number of the at least one static random access memory cell is plural, and at a side of the first gate line and the second gate line away from the recessed gate line, the first strip doped region and the fourth strip doped region between every two adjacent static random access memory cell may be electrically connected through a fourth connection component.

According to an embodiment of the invention, in the static random access memory, the fourth connection component may be a slit contact, a doped region for connection, or a combination of a conductive line and a contact.

Based on above, in the static random access memory according to the embodiments of the invention, the recessed gate line is adopted as the gate of the pass-gate transistor. Therefore, the gate size of the pass-gate transistor is effectively reduced, and a distance between the recessed gate line and an adjacent interconnect component is significantly reduced as well. In this way, a size of the static random access memory cell is effectively reduced, and the integrity of the memory device is consequently increased. Besides, with the gate layout of the static random access memory cell, performances of the pass-gate transistors and performances of the pull-down transistors are able to be respectively controlled. In addition, the gate layout of the static random access memory cell may be manufactured by easier optical proximity correction (OPC) and easier manufacturing processes.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF THE EMBODIMENTS

Figure 1A:
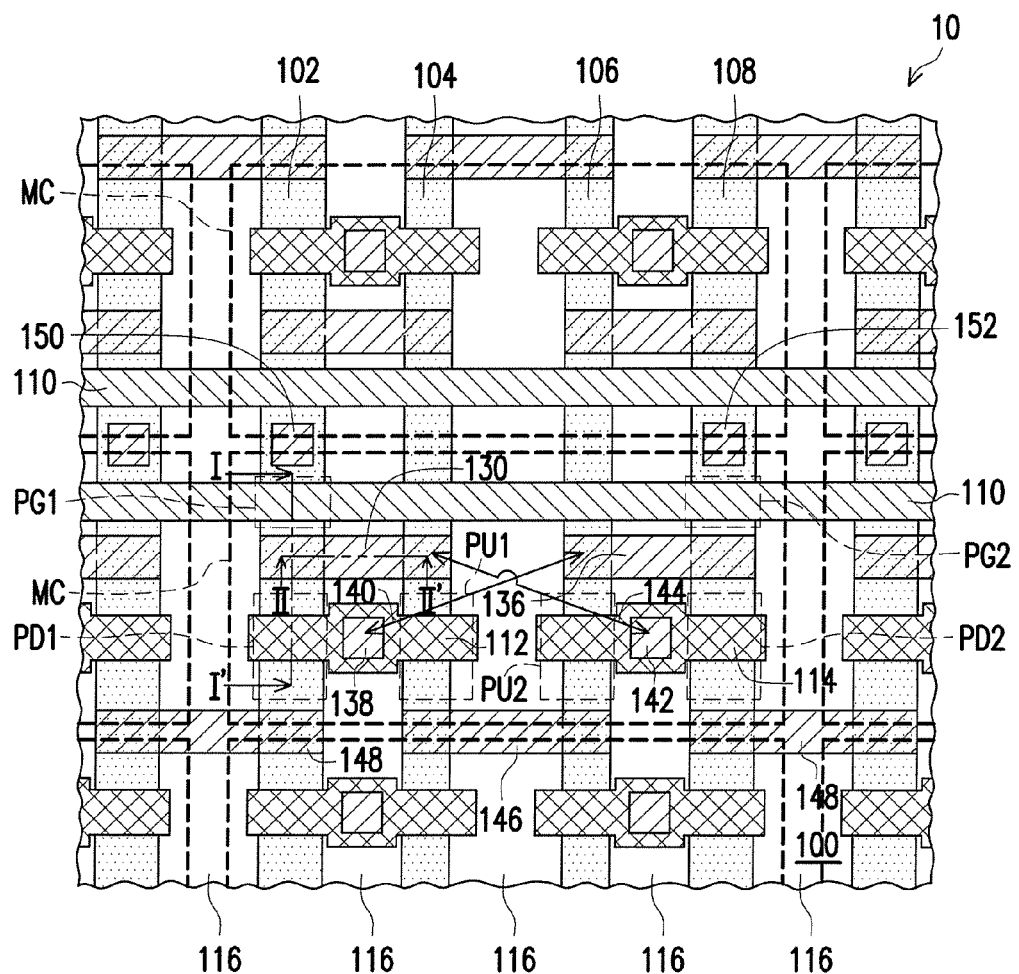
FIG. 1A is a top view illustrating a static random access memory according to the first embodiment of the invention.

Reference will now be made in detail to the embodiments of the disclosure, examples of which are illustrated in the accompanying drawings. Wherever possible, the same reference numbers are used in the drawings and the description to refer to the same or like parts.

In the following, the embodiments of the invention are described in detail with reference to the accompanying drawings. It should be noted that the invention can be implemented in various forms, and is not limited to the embodiments described hereinafter. The terms used to describe the directions such as "above" or the like in the following embodiments merely indicate the directions in the accompanying drawings. Thus, such language describing the directions merely serves to provide a more detailed description, instead of limiting the invention. Besides, for the purpose of clarity, the sizes and relative sizes of each of the layers in the drawings may be illustrated in exaggerated proportions.

Figure 1B:
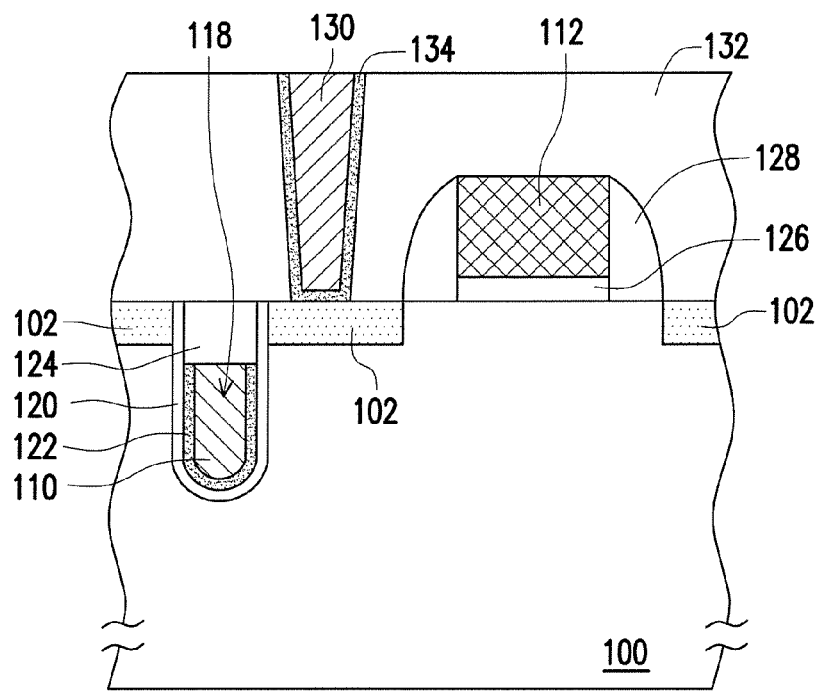
FIG. 1B is a cross-sectional view taken along a cross-sectional line I-I' of FIG. 1A.
Figure 1C:
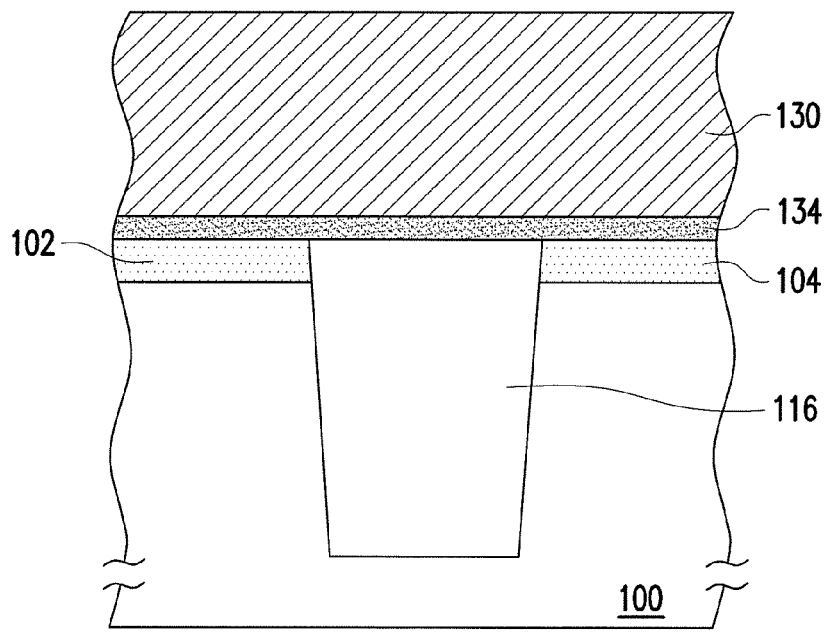
FIG. 1C is a cross-sectional view taken along a cross-sectional line II-IP of FIG. 1A.

FIG. 1A is a top view illustrating a static random access memory according to the first embodiment of the invention. In FIG. 1A, dielectric layers and spacers are omitted to make the description clearer. FIG. 1B is a cross-sectional view taken along a cross-sectional line I-I' of FIG. 1A. FIG. 1C is a cross-sectional view taken along a cross-sectional line II-IP of FIG. 1A.

Referring to FIG. 1A, a static random access memory 10 includes at least one static random access memory cell MC. In this embodiment, the static random access memory 10 is described as including a plurality of the static random access memory cells MC, for example. A gate layout of the static random access memory cell MC includes a strip doped region 102, a strip doped region 104, a strip doped region 106, a strip doped region 108, a recessed gate line 110, a gate line 112, and a gate line 114. In addition, the static random access memory cell MC may include pass-gate transistors PG1 and PG2, pull-down transistors PD1 and PD2, and pull-up transistors PU1 and PU2. In this embodiment, the pass-gate transistors PG1 and PG2, and the pull-down transistors PD1 and PD2 are respectively described as an N-type metal oxide semiconductor (NMOS) transistor, for example, and the pull-up transistors PU1 and PU2 are respectively described as a P-type metal oxide semiconductor (PMOS) transistor, for example.

The strip doped region 102, the strip doped region 104, the strip doped region 106, and the strip doped region 108 are disposed in a substrate 100 in order and separated from each other. The strip doped region 102 and the strip doped region 108 may have a first conductivity type, and the strip doped region 104 and the strip doped region 106 may have a second conductivity type. In addition, the first and second conductivity types are different conductivity types. The strip doped region 102 and the strip doped region 108 may respectively serve as sources and drains in the pass-gate transistors PG1 and PG2 and sources and drains in the pull-down transistors PD1 and PD2. The strip doped region 104 and the strip doped region 106 may respectively serve as sources and drains in the pull-up transistors PU1 and PU2. The substrate 100 is a semiconductor substrate such as a silicon substrate, for example. In this embodiment, the first conductivity type is N-type, for example, and the second conductivity type is P-type, for example.

Moreover, the static random access memory 10 further includes an isolation structure 116. The isolation structure 116 is disposed between adjacent two of the strip doped region 102, the strip doped region 104, the strip doped region 106, and the strip doped region 108. The isolation structure 116 is a shallow trench isolation (STI) structure, for example. The material of the isolation structure 116 is silicon oxide, for example.

Referring to FIGS. 1A and 1B together, the recessed gate line 110 intersects the strip doped region 102, the strip doped region 104, the strip doped region 106, and the strip doped region 108. The strip doped region 102, the strip doped region 104, the strip doped region 106, and the strip doped region 108 are disconnected at intersections with the recessed gate line 110. The recessed gate line 110 may serve as gates in the pass-gate transistors PG1 and PG2. A top surface of the recessed gate line 110 may be lower than a top surface of the substrate 100.

In the following, the configuration of the recessed gate line 110 is described by using the pass-gate transistor PG1 as an example. The recessed gate line 110 may be disposed in a trench 118. A material of the recessed gate line 110 includes tungsten, copper, or aluminum, for example. In addition, a dielectric layer 120 may be disposed on the trench 118, and a barrier layer 122 may be disposed between the dielectric layer 120 and the recessed gate line 110. In addition, a cap layer 124 filling into the trench 118 may be disposed on the recessed gate line 110. A material of the dielectric layer 120 includes silicon oxide, for example. A material of the barrier layer 122 includes TiN, for example. A material of the cap layer 124 is silicon oxide, for example.

Since the recessed gate line 110 is adopted as the gates of the pass-gate transistors PG1 and PG2, the pass-gate transistors PG1 and PG2 may have U-shaped channel regions, and gate sizes of the pass-gate transistors PG1 and PG2 may consequently be further reduced. Thus, a size of the static random access memory cell MC may be reduced. In addition, the recessed gate line 110 may be electrically connected to the gate of the pass-gate transistor PG1 and the gate of the pass-gate transistor PG2. Thus, the recessed gate line 110 may serve as a word line, and it does not require an additional interconnect structure to electrically connect the gate of the pass-gate transistor PG1 and the gate of the pass-gate transistor PG2. Thus, the size of the static random access memory cell MC may be further reduced.

The gate line 112 intersects the strip doped region 102 and the strip doped region 104. The strip doped region 102 and the strip doped region 104 are disconnected at intersections with the gate line 112. The gate line 112 may serve as gates in the pull-down transistor PD1 and the pull-up transistor PU1. The gate line 114 intersects the strip doped region 106 and the strip doped region 108. The strip doped region 106 and the strip doped region 108 are disconnected at intersections with the gate line 114. The gate line 114 may serve as gates in the pull-down transistor PD2 and the pull-up transistor PU2. The gate line 112 and the gate line 114 may respectively be a planar conductive line or a recessed conductive line. The planar conductive line refers to a conductive line structure where a conductive line is located on the top surface of the substrate 100. The recessed conductive line refers to a conductive line structure where a top surface of a conductive line is lower than the top surface of the substrate 100, and the structure of the recessed conductive line is similar to the structure of the recessed gate line 110. Thus, details concerning the recessed conductive line are referred to the description of the recessed gate line 110 and not repeated in the following. In this embodiment, the gate line 112 and the gate line 114 are described as planar conductive lines, for example.

In the following, the configuration of the planar conductive line is described by using the gate line 112 of the pull-down transistor PD1 as an example. The gate line 112 may be disposed on the substrate 100. A material of the gate line 112 includes a conductive material, for example, such as doped polysilicon, a combination of doped polysilicon and silicon salicide or a combination of doped polysilicon and metal. Besides, a dielectric layer 126 may be disposed between the gate line 112 and the substrate 110, and a spacer 128 may be disposed on a sidewall of the gate line 112. A material of the dielectric layer 126 includes silicon oxide, for example. A material of the spacer 128 includes silicon oxide or silicon nitride, for example. In addition, details concerning the structure of the gate line 114 adopting the planar conductive line may be referred to the description about the gate line 112, and thus not repeated in the following.

With the gate layout of the static random access memory cell MC, performances of the pass-gate transistors PG1 and PG2 and performances of the pull-down transistors PD1 and PD2 may be controlled respectively. In addition, the gate layout of the static random access memory cell MC may be manufactured by easier optical proximity correction and easier manufacturing processes.

Referring to FIGS. 1A to 1C, the strip doped region 102 and the strip doped region 104 located between the recessed gate line 110 and the gate line 112 may be electrically connected through a connection component 130. The connection component 130 may be a slit contact or a combination of a conductive line and a contact. A material of the connection component 130 includes tungsten, copper, or aluminum, for example. In this embodiment, the connection component 130 is described as a slit contact, for example. The slit contact refers to an elongated contact structure extending to above two or more components to be electrically connected for electrical connection. In other embodiments, the connection component 130 may also be a conventional interconnect structure that uses a conductive line and a contact in combination. Compared with the conventional interconnect structure that uses a conductive line and a contact in combination, when the slit contact is adopted as the connection component 130, a size of the slit contact in the shorter direction of the slit contact may be effectively reduced, so as to further reduce the size of the static random access memory cell MC.

In the following, the configuration of the slit contact is described by using the connection component 130 as an example. The connection component 130 may be disposed in a dielectric layer 132, extend to above the strip doped region 102 and the strip doped region 104, and electrically connect the strip doped region 102 and the strip doped region 104 at two sides of the isolation structure 116. A material of the dielectric layer 132 includes silicon oxide, for example. In addition, a barrier layer 134 may be further disposed between the connection component 130 and the dielectric layer 132, between the connection component 130 and the strip doped region 102, and between the connection component 130 and the strip doped region 104. A material of the barrier layer 134 includes TiN, for example.

In addition, the strip doped region 106 and the strip doped region 108 located between the recessed gate line 110 and the gate line 114 may be electrically connected through a connection component 136. The connection component 136 may be a slit contact or a combination of a conductive line and a contact. A material of the connection component 136 includes tungsten, copper, or aluminum, for example. In this embodiment, the connection component 136 is described as a slit contact, for example. In other embodiments, the connection component 136 may also be a conventional interconnect structure that uses a conductive line and a contact in combination. Compared with the conventional interconnect structure that uses a conductive line and a contact in combination, when the slit contact is adopted as the connection component 136, a size of the slit contact in the shorter direction of the slit contact may be effectively reduced, so as to further reduce the size of the static random access memory cell MC.

The gate line 112 may be electrically connected to the connection component 136, and the gate line 114 may be electrically connected to the connection component 130. The gate line 112 is electrically connected to the connection component 136 by using a contact 138 and a conductive line 140, for example. However, the invention is not limited thereto. The gate line 114 is electrically connected to the connection component 130 by using a contact 142 and a conductive line 144, for example. However, the invention is not limited thereto. For the ease of illustration in FIG. 1A, the conductive lines 140 and 144 are represented by double-arrows. However, the conductive lines 140 and 144 may respectively be an interconnect component manufactured by performing a process for manufacturing an interconnect component. Materials of the contact 138, the conductive line 140, the contact 142, and the conductive line 144 may respectively include tungsten, copper, or aluminum, for example.

Figure 2:
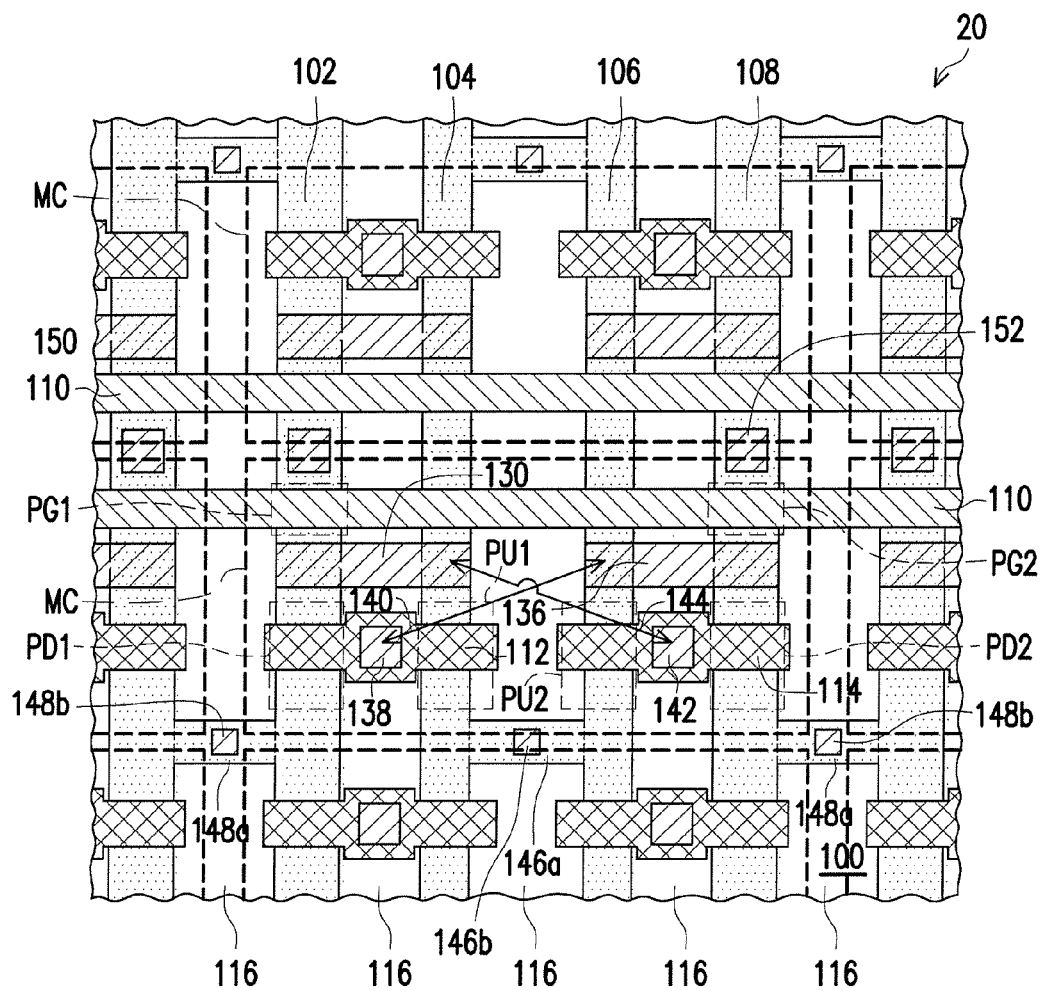
FIG. 2 is a top view illustrating a static random access memory according to the second embodiment of the invention.

At a side of the gate line 112 and the gate line 114 away from the recessed gate line 110, the strip doped region 104 and the strip doped region 106 may be electrically connected through a connection component 146. The connection component 146 may electrically connect a terminal of the pull-up transistors PU1 and PU2 to a high reference voltage, such as Vdd. The connection component 146 may be a slit contact, a doped region for connection (as shown in FIG. 2), or a combination of a conductive line and a contact. A material of the connection component 146 includes tungsten, copper, or aluminum, for example. In this embodiment, the connection component 146 is described as a slit contact, for example. In other embodiments, the connection component 146 may also be a doped region for connection or a conventional interconnect structure that uses a conductive line and a contact in combination. Compared with the conventional interconnect structure that uses a conductive line and a contact in combination, when the slit contact is adopted as the connection component 146, a size of the slit contact in the shorter direction of the slit contact may be effectively reduced, so as to further reduce the size of the static random access memory cell MC.

At a side of the gate line 112 and the gate line 114 away from the recessed gate lines 110, the strip doped region 102 and the strip doped region 108 located between every two adjacent static random access memory cells MC may be electrically connected through a connection component 148.

The connection component 148 may electrically connect a terminal of the pull-down transistors PD1 and PD2 to a low reference voltage, such as Vss or the ground voltage. The connection component 148 may be a slit contact, a doped region for connection (as shown in FIG. 2), or a combination of a conductive line and a contact. A material of the connection component 148 includes tungsten, copper, or aluminum, for example. In this embodiment, the connection component 148 is described as a slit contact, for example. In other embodiments, the connection component 148 may also be a doped region for connection or a conventional interconnect structure that uses a conductive line and a contact in combination. Compared with the conventional interconnect structure that uses a conductive line and a contact in combination, when the slit contact is adopted as the connection component 148, a size of the slit contact in the shorter direction of the slit contact may be effectively reduced, so as to further reduce the size of the static random access memory cell MC.

Referring to FIG. 1A, the static random access memory cell MC further includes contacts 150 and 152. The contacts 150 and 152 are respectively connected to the strip doped region 102 and the strip doped region 108 at a side of the recessed gate line 110 away from the gate line 112 and the gate line 114. The contact 150 may electrically connect a terminal of the pass-gate transistor PG1 to a bit line. The contact 152 may electrically connect a terminal of the pass-gate transistor PG2 to another bit line. Materials of the contacts 150 and 152 include tungsten, copper, or aluminum, for example.

Based on the above embodiment, it can be known that since the recessed gate line 110 is adopted as the gates of the pass-gate transistors PG1 and PG2, the gate sizes of the pass-gate transistors PG1 and PG2 may be effectively reduced, and a distance between the recessed gate line 110 and an adjacent interconnect component (the connection components 130 and 136 and the contacts 150 and 152) may be significantly reduced as well. In this way, the size of the static random access memory cell MC is effectively reduced, and the integrity of the memory device is consequently increased. Besides, with the gate layout of the static random access memory cell MC, performances of the pass-gate transistors PG1 and PG2 and performances of the pull-down transistors PD1 and PD2 may be respectively controlled. In addition, the gate layout of the static random access memory cell MC may be manufactured by easier optical proximity correction and easier manufacturing processes.

FIG. 2 is a top view illustrating a static random access memory according to the second embodiment of the invention. In FIG. 2, dielectric layers and spacers are omitted to make the description clearer.

Referring to FIGS. 1A and 2 together, a static random access memory 20 shown in FIG. 2 and the static random access memory 10 shown in FIG. 1 have the following differences. In the static random access memory 20, connection components 146a and 148a are respectively a doped region for connection. The connection component 146a and the strip doped regions 104 and 106 may have the same second conductivity type, so as to be formed in the same ion implantation process. The connection component 148a and the strip doped regions 102 and 108 may have the same first conductivity type, so as to be formed in the same ion implantation process. The connection component 146a may electrically connect to a high reference voltage (Vdd) by a contact 146b. The connection component 148a may electrically connect to a low reference voltage (Vss or the ground voltage) by a contact 148b. In addition, components in FIG. 2 that are the same as the components in FIG. 1 are represented by the same reference symbols, and the descriptions thereof are thus not repeated.

Compared with the first embodiment shown in FIG. 1, the second embodiment of FIG. 2 adopts the doped regions for connection as the connection components 146a and 148a. Therefore, the size of the static random access memory cell MC may be further reduced.

Figure 3:
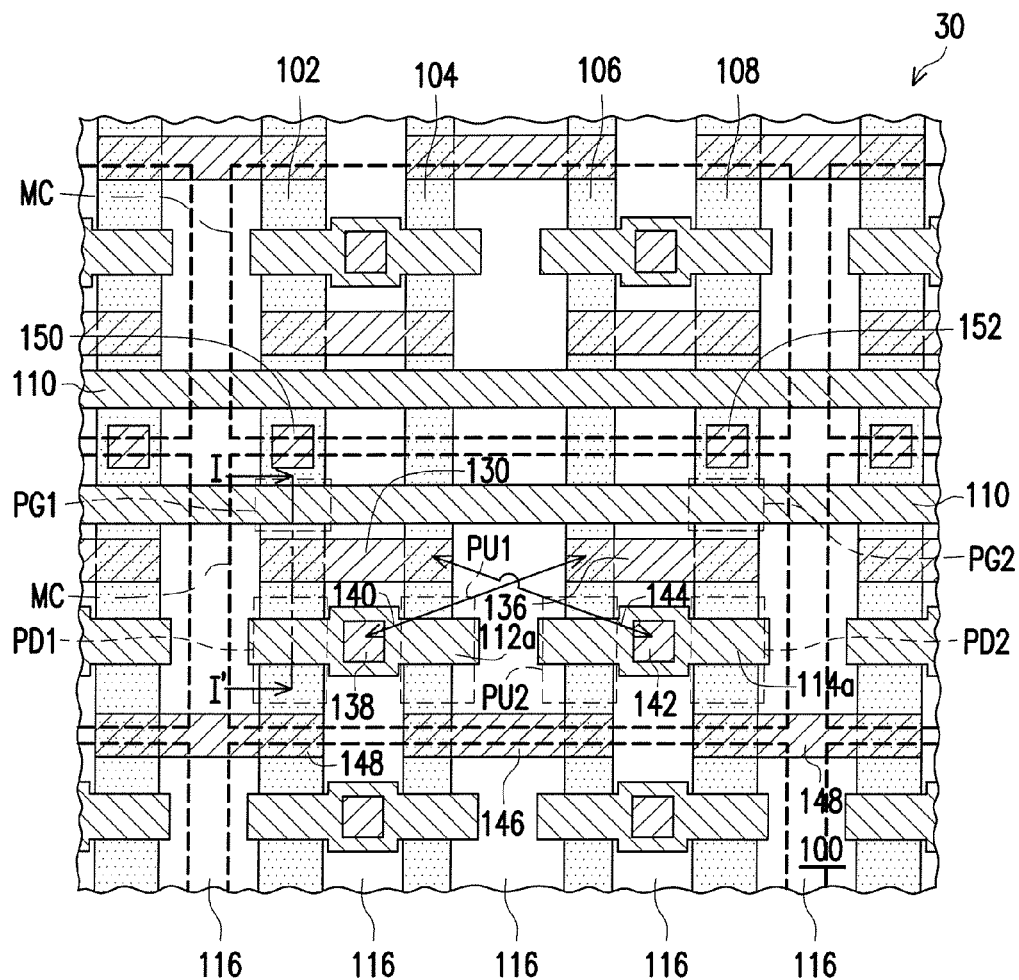
FIG. 3 is a top view illustrating a static random access memory according to the third embodiment of the invention.

FIG. 3 is a top view illustrating a static random access memory according to the third embodiment of the invention. In FIG. 3, dielectric layers and spacers are omitted to make the description clearer.

Referring to FIGS. 1A and 3 together, a static random access memory 30 shown in FIG. 3 and the static random access memory 10 shown in FIG. 1 have the following differences. In the static random access memory 30 shown in FIG. 3, gate lines 112a and 114a are respectively a recessed conductive line. In addition, components in FIG. 3 that are the same as the components in FIG. 1 are represented by the same reference symbols, and the descriptions thereof are thus not repeated.

Compared with the first embodiment shown in FIG. 1, the recessed conductive lines are adopted in the third embodiment shown in FIG. 3 as the gate lines 112a and 114a. Therefore, the size of the static random access memory cell may be further reduced.

Based on above, the recessed gate line is adopted as the gate of the pass-gate transistor in the static random access memory according to the above embodiments. Therefore, the size of the static random access memory cell is able to be effectively reduced, so as to increase the integrity of the memory device. Besides, with the gate layout of the static random access memory cell, the performances of the pass-gate transistor and the pull-down transistor are able to be respectively controlled. Furthermore, the static random access memory cell may be manufactured by easier optical proximity correction and easier manufacturing processes.

It will be apparent to those skilled in the art that various modifications and variations can be made to the structure of the disclosure without departing from the scope or spirit of the disclosure. In view of the foregoing, it is intended that the disclosure cover modifications and variations of the disclosure provided they fall within the scope of the following claims and their equivalents.

What is claimed is:

1. A static random access memory, comprising at least one static random access memory cell, wherein a gate layout of the static random access memory cell comprises:
   a first strip doped region, a second strip doped region, a third strip doped region, and a fourth strip doped region, disposed in a substrate in order and separated from each other;
   a recessed gate line, intersecting the first strip doped region, the second strip doped region, the third strip doped region, and the fourth strip doped region, wherein the first strip doped region, the second strip doped region, the third strip doped region, and the fourth strip doped region are disconnected at intersections with the recessed gate line;
   a first gate line, intersecting the first strip doped region and the second strip doped region, wherein the first strip doped region and the second strip doped region are disconnected at intersections with the first gate line; and
   a second gate line, intersecting the third strip doped region and the fourth strip doped region, wherein the third strip doped region and the fourth strip doped region are disconnected at intersections with the second gate line.

2. The static random access memory as claimed in claim 1, wherein the first strip doped region and the fourth strip doped region have a first conductivity type, and the second strip doped region and the third strip doped region have a second conductivity type.

3. The static random access memory as claimed in claim 1, wherein a top surface of the recessed gate line is lower than a top surface of the substrate.

4. The static random access memory as claimed in claim 1, wherein the first gate line comprises a planar conductive line or a recessed conductive line.

5. The static random access memory as claimed in claim 1, wherein the second gate line comprises a planar conductive line or a recessed conductive line.

6. The static random access memory as claimed in claim 1, wherein the first strip doped region and the second strip doped region between the recessed gate line and the first gate line are electrically connected through a first connection component.

7. The static random access memory as claimed in claim 6, wherein the first connection component comprises a slit contact or a combination of a conductive line and a contact.

8. The static random access memory as claimed in claim 6, wherein the second gate line is electrically connected to the first connection component.

9. The static random access memory as claimed in claim 1, wherein the third strip doped region and the fourth strip doped region between the recessed gate line and the second gate line are electrically connected through a second connection component.

10. The static random access memory as claimed in claim 9, wherein the second connection component comprises a slit contact or a combination of a conductive line and a contact.

11. The static random access memory as claimed in claim 9, wherein the first gate line is electrically connected to the second connection component.

12. The static random access memory as claimed in claim 1, wherein at a side of the first gate line and the second gate line away from the recessed gate line, the second strip doped region and the third strip doped region are electrically connected through a third connection component.

13. The static random access memory as claimed in claim 12, wherein the third connection component comprises a slit contact, a doped region for connection, or a combination of a conductive line and a contact.

14. The static random access memory as claimed in claim 1, wherein the number of the at least one static random access memory cell is plural, and at a side of the first gate line and the second gate line away from the recessed gate line, the first strip doped region and the fourth strip doped region between every two adjacent static random access memory cell are electrically connected through a fourth connection component.

15. The static random access memory as claimed in claim 14, wherein the fourth connection component comprises a slit contact, a doped region for connection, or a combination of a conductive line and a contact.

* * * * *